(12) United States Patent
Leung (10) Patent No.: US 10,920,826 B2
(45) Date of Patent: Feb. 16, 2021

(54) RADIAL BEARING WITH WEAR RESISTANT INSERTS AND A WEAR RESISTANT COATING

(71) Applicant: Halliburton Energy Services, Inc., Houston, TX (US)

(72) Inventor: Philip Park-Hung Leung, Edmonton (CA)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 16/476,504

(22) PCT Filed: Mar. 17, 2017

(86) PCT No.: PCT/CA2017/050346
§ 371 (c)(1),
(2) Date: Jul. 8, 2019

(87) PCT Pub. No.: WO2018/165734
PCT Pub. Date: Sep. 20, 2018

(65) Prior Publication Data
US 2019/0352966 A1    Nov. 21, 2019

(51) Int. Cl.
*F16C 33/04* (2006.01)
*E21B 4/00* (2006.01)
(Continued)

(52) U.S. Cl.
CPC ............ *F16C 33/043* (2013.01); *E21B 4/003* (2013.01); *F16C 17/02* (2013.01); *F16C 33/121* (2013.01);
(Continued)

(58) Field of Classification Search
CPC ........ F16C 17/02; F16C 17/26; F16C 33/043; F16C 33/08; F16C 33/12; F16C 33/121;
(Continued)

(56) References Cited

U.S. PATENT DOCUMENTS 8,727,044 B2 * 5/2014 Qian .................. B22F 5/00
175/433
8,795,794 B2   8/2014 Dezert et al.
(Continued)

FOREIGN PATENT DOCUMENTS

DE    2747399 A1    4/1979
GB    2130306 A     5/1984
(Continued)

OTHER PUBLICATIONS

US Synthetic Bearings and US Synthetic Corp, "Diamond Thrust Bearings", downloaded from http://www.ussbearings.com/bearings_site/products_article/25/, 2014.
(Continued)

*Primary Examiner* — James Pilkington
(74) *Attorney, Agent, or Firm* — Parlee McLaws, LLP; Patrick Laycock; Craig W. Roddy (57) ABSTRACT

A radial bearing for transmitting a radial load, including a first radial bearing component having an inner surface defining a bore and a second radial bearing component received within the bore of the first radial bearing component and having an outer surface. The first radial bearing component includes a plurality of first component wear resistant inserts arranged and mounted on the inner surface. The second radial bearing component includes a second component wear resistant coating on at least a portion of the outer surface. The first radial bearing component and the second radial bearing component interact to transmit the radial load between the first radial bearing component and the second radial bearing component.

24 Claims, 6 Drawing Sheets

(51) Int. Cl.
 *F16C 17/02* (2006.01)
 *F16C 33/12* (2006.01)
 *F16C 33/24* (2006.01)

(52) U.S. Cl.
 CPC .......... *F16C 33/24* (2013.01); *F16C 2206/04* (2013.01); *F16C 2206/82* (2013.01); *F16C 2226/34* (2013.01); *F16C 2352/00* (2013.01)

(58) Field of Classification Search
 CPC .... F16C 33/122; F16C 33/124; F16C 33/125; F16C 33/24; F16C 2206/04; F16C 2206/82; F16C 2226/34; F16C 2352/00
 See application file for complete search history.

(56) References Cited

U.S. PATENT DOCUMENTS 9,127,708 B2 * 9/2015 Gonzalez ................. E21B 3/00
9,657,775 B2 * 5/2017 Otschik ................. F16C 17/028
2006/0283017 A1 * 12/2006 von Gynz-Rekowski ...................
                 B21D 53/10
                  29/898.04

FOREIGN PATENT DOCUMENTS

JP  2006220257 * 8/2006
WO  2018044599 A1  3/2018

OTHER PUBLICATIONS

US Synthetic Bearings and US Synthetic Corp, "Radial Bearings", downloaded from http://www.ussbearings.com/bearings_site/products_article/24/, 2014.

US Synthetic Bearings and US Synthetic Corp, "Combination Bearings", downloaded from http://www.ussbearings.com/bearings_site/products_article/944/, 2014.

* cited by examiner

RADIAL BEARING WITH WEAR RESISTANT INSERTS AND A WEAR RESISTANT COATING

TECHNICAL FIELD

A hybrid radial bearing including a first radial bearing component with a plurality of wear resistant inserts and a second radial bearing component with a wear resistant coating.

BACKGROUND OF THE INVENTION

In various industries, bearings may be used to support rotating and/or reciprocating components axially and/or radially. Examples of bearings include radial bearings for resisting radial loads and thrust bearings for supporting axial loads. Bearings may be provided in various bearing configurations in rotating and/or reciprocating equipment for at least partially supporting radial and/or axial loads. Such bearings may be used in the oil and gas industry, where holes may be drilled in subterranean formations using rotating and/or reciprocating equipment.

BRIEF DESCRIPTION OF DRAWINGS

Embodiments of the invention will now be described with reference to the accompanying drawings, in which.

DETAILED DESCRIPTION

This description is directed, in part, to a radial bearing for transmitting a radial load between radial bearing components.

The radial bearing described herein may be used in any environment and/or in any apparatus in which a radial bearing is required. The radial bearing described herein may be particularly suited for use in environments and/or in apparatus in which a radial load may not be distributed evenly on a radial bearing component, such that the radial bearing component may be susceptible to uneven wear.

As a non-limiting example, the radial bearing described herein may be a component of an apparatus for use in a borehole. The apparatus may be any apparatus which is suitable to be inserted within a borehole. As a non-limiting example, the apparatus may be a drilling apparatus for use in drilling a borehole. As non-limiting examples, such a drilling apparatus may comprise, consist of, or consist essentially of a drilling motor, a rotary steerable drilling apparatus, a turbine, a reciprocating hammer, or any other apparatus which is suitable for use in drilling a borehole.

The radial bearing may comprise a first radial bearing component and a second radial bearing component.

The first radial bearing component may have an inner surface. The inner surface may be continuous or may be intermittent. The inner surface of the first radial bearing component may define a bore. The second radial bearing component may have an outer surface. The outer surface may be continuous or may be intermittent. The radial bearing may be configured so that the second radial bearing component is rotatably and/or reciprocably received within the bore of the first radial bearing component. The inner surface of the first radial bearing component, the bore of the first radial bearing component and the outer surface of the second radial bearing component may each have any compatible shape which facilitates the desired relative movement between the first radial bearing component and the second radial bearing component. As a non-limiting example, the inner surface of the first radial bearing component and the outer surface of the second radial bearing component may have complementary generally cylindrical shapes, and/or the bore of the first radial bearing component and the outer surface of the second radial bearing component may have complementary generally cylindrical shapes.

The first radial bearing component and the second radial bearing component may be configured to interact to transmit radial loads between the first radial bearing component and the second radial bearing component.

The first radial bearing component may comprise a plurality of first component wear resistant inserts arranged and mounted on the inner surface.

The first component wear resistant inserts may have any suitable cross-section or combination of cross-sections, including, as non-limiting examples, a round, oval or polygonal cross-section. The first component wear resistant inserts may have any suitable shape or combination of shapes including, as non-limiting examples, a cylindrical, prismatic, or conical shape.

The first component wear resistant inserts may comprise, consist of, or consist essentially of any material or combination of materials suitable for resisting wear of the first radial bearing component. As non-limiting examples, the first component wear resistant inserts may comprise, consist of, or consist essentially of tungsten carbide, a non-metallic crystalline wear resistant material, or a combination thereof. As non-limiting examples, the non-metallic crystalline wear resistant material may comprise, consist of, or consist essentially of polycrystalline diamond, polycrystalline cubic boron nitride, or a combination thereof. As non-limiting examples, tungsten carbide inserts may be provided as cast tungsten carbide and/or sintered tungsten carbide. Sintered tungsten carbide may be sintered in any suitable manner including, as a non-limiting example, by hot isostatic pressing of particles of tungsten carbide.

Some or all of the first component wear resistant inserts may comprise a first insert matrix and particles of a wear resistant material dispersed in the first insert matrix.

The first insert matrix may comprise, consist of, or consist essentially of any material or combination of materials suitable for supporting the particles of the wear resistant material dispersed therein. As non-limiting examples, the first insert matrix may comprise, consist of, or consist essentially of tungsten carbide and/or silicon carbide. The first insert matrix may be selected to have similar material properties to those of the particles of the wear resistant material dispersed therein such as, as a non-limiting example, a similar coefficient of thermal expansion. Providing a similar coefficient of thermal expansion for the first insert matrix and the particles of the wear resistant material may increase the thermal stability of the first component wear resistant inserts.

The particles of the wear resistant material dispersed in the first insert matrix may be provided in any suitable shape including, as non-limiting examples, as spherical, prismatic or angular particles.

The particles of the wear resistant material dispersed in the first insert matrix may comprise, consist of, or consist essentially of any material or combination of materials suitable for resisting wear of the first radial bearing component. As non-limiting examples, the particles of the wear resistant material may comprise, consist of, or consist essentially of particles of tungsten carbide, particles of a non-metallic crystalline wear resistant material, or a combination thereof. As non-limiting examples, the non-metallic crystalline wear resistant material may comprise, consist of, or consist essentially of polycrystalline diamond, polycrystalline cubic boron nitride, or a combination thereof. As non-limiting examples, tungsten carbide particles may be provided as crushed cast tungsten carbide, spherical cast tungsten carbide, and/or crushed sintered tungsten carbide. Sintered tungsten carbide may be sintered in any suitable manner including, as a non-limiting example, by hot isostatic pressing of particles of tungsten carbide.

Some or all of the first component wear resistant inserts may comprise a backing substrate. The backing substrate may comprise, consist of, or consist essentially of any material or combination of materials suitable for mounting the first component wear resistant inserts to the inner surface of the first radial bearing component. As a non-limiting example, the backing substrate may comprise, consist of, or consist essentially of tungsten carbide. As non-limiting examples, tungsten carbide as a backing substrate may be provided as cast tungsten carbide and/or sintered tungsten carbide. Sintered tungsten carbide may be sintered in any suitable manner including, as a non-limiting example, by hot isostatic pressing of particles of tungsten carbide.

The first component wear resistant inserts may be mounted on the inner surface of the first radial bearing component in any suitable manner including, as non-limiting examples, by thermal fit, interference fit, welding, brazing, soldering, adhesive etc. The inner surface of the first radial bearing component may define a plurality of pockets arranged on the inner surface in which the first component wear resistant inserts may be mounted in any suitable manner including, as non-limiting examples, by thermal fit, interference fit, welding, brazing, soldering, adhesive etc.

The first component wear resistant inserts may be mounted on the inner surface of the first radial bearing component so that they protrude from the inner surface of the first radial bearing component and thereby protect the inner surface of the first radial bearing component from wear, or the first component wear resistant inserts may be mounted on the inner surface of the first radial bearing component so that they are substantially flush with the inner surface of the first radial bearing component.

The second radial bearing component may comprise a second component wear resistant coating on at least a portion of the outer surface.

The second component wear resistant coating may comprise a single continuous coating segment or a plurality of discrete coating segments. As non-limiting examples, a plurality of discrete coating segments may be provided as rings or ring segments. A single continuous coating segment and/or a plurality of discrete coating segments may be formed separately from the second radial bearing component and subsequently applied to the outer surface of the second radial bearing component in a suitable manner, may be formed integrally with the second radial bearing component, or may be applied to the outer surface of the second radial bearing component in a suitable manner.

The second component wear resistant coating may comprise, consist of, or consist essentially of any suitable material or combination of materials. The second component wear resistant coating may consist of or consist essentially of a wear resistant material, or the second component wear resistant coating may further comprise one or more additional materials for supporting the wear resistant material. The wear resistant material may comprise, consist of, or consist essentially of any material or combination of materials which is suitable for resisting wear of the second radial bearing component.

As a non-limiting example, the second component wear resistant coating may consist of or consist essentially of tungsten carbide as the wear resistant material. As non-limiting examples, tungsten carbide coatings may be provided as cast tungsten carbide and/or sintered tungsten carbide. Sintered tungsten carbide may be sintered in any suitable manner including, as a non-limiting example, by hot isostatic pressing of particles of tungsten carbide.

As a second non-limiting example, the second component wear resistant coating may comprise a coating matrix for supporting the wear resistant material. Particles of the wear resistant material may be dispersed in the coating matrix and/or a plurality of second component wear resistant inserts may be arranged in the coating matrix.

The coating matrix may comprise, consist of, or consist essentially of any material or combination of materials suitable for supporting the particles of the wear resistant material dispersed therein and/or the second component wear resistant inserts arranged therein and for applying the second component wear resistant coating on the outer surface of the second radial bearing component. As a non-limiting example, the coating matrix may comprise, consist of, or consist essentially of a braze alloy. As non-limiting examples, the braze alloy may comprise, consist of, or consist essentially of a copper based braze alloy, a nickel based braze alloy, a cobalt based braze alloy, or combinations thereof.

The particles of the wear resistant material dispersed in the coating matrix may be provided in any suitable shape including, as non-limiting examples, as spherical, prismatic or angular particles.

The particles of the wear resistant material dispersed in the coating matrix may comprise, consist of, or consist essentially of any material or combination of materials suitable for resisting wear of the second radial bearing component. As non-limiting examples, the particles of the wear resistant material may comprise, consist of, or consist essentially of tungsten carbide or a non-metallic crystalline wear resistant material. As non-limiting examples, the non-metallic crystalline wear resistant material may comprise, consist of, or consist essentially of polycrystalline diamond, polycrystalline cubic boron nitride, or a combination thereof. As non-limiting examples, tungsten carbide particles may be provided as crushed cast tungsten carbide, spherical cast tungsten carbide, or crushed sintered tungsten carbide. Sintered tungsten carbide may be sintered in any suitable manner including, as a non-limiting example, by hot isostatic pressing of particles of tungsten carbide.

The second component wear resistant inserts may have any suitable cross-section or combination of cross-sections, including, as non-limiting examples, a round, oval or polygonal cross-section. The second component wear resistant inserts may have any suitable shape or combination of shapes including, as non-limiting examples, a cylindrical, prismatic, or conical shape.

The second component wear resistant inserts may comprise, consist of, or consist essentially of any material or combination of materials suitable for resisting wear of the second radial bearing component. As non-limiting examples, the second component wear resistant inserts may comprise, consist of, or consist essentially of tungsten carbide, a non-metallic crystalline wear resistant material, or a combination thereof. As non-limiting examples, the non-metallic crystalline wear resistant material may comprise, consist of, or consist essentially of polycrystalline diamond, polycrystalline cubic boron nitride, or a combination thereof. As non-limiting examples, tungsten carbide inserts may be provided as cast tungsten carbide and/or sintered tungsten carbide. Sintered tungsten carbide may be sintered in any suitable manner including, as a non-limiting example, by hot isostatic pressing of particles of tungsten carbide.

Some or all of the second component wear resistant inserts may comprise a second insert matrix and particles of a wear resistant material dispersed in the second insert matrix.

The second insert matrix may comprise, consist of, or consist essentially of any material or combination of materials suitable for supporting the particles of the wear resistant materials dispersed therein. As non-limiting examples, the second insert matrix may comprise, consist of, or consist essentially of tungsten carbide and/or silicon carbide. The second insert matrix may be selected to have similar material properties to those of the particles of the wear resistant material dispersed therein such as, as a non-limiting example, a similar coefficient of thermal expansion. Providing a similar coefficient of thermal expansion for the second insert matrix and the particles of the wear resistant material may increase the thermal stability of the second component wear resistant inserts.

The particles of the wear resistant material dispersed in the second insert matrix may be provided in any suitable shape including, as non-limiting examples, as spherical, prismatic or angular particles.

The particles of the wear resistant material dispersed in the second insert matrix may comprise, consist of, or consist essentially of any material or combination of materials suitable for resisting wear of the second radial bearing component. As non-limiting examples, the particles of the wear resistant material may comprise, consist of, or consist essentially of particles of tungsten carbide, particles of a non-metallic crystalline wear resistant material, or a combination thereof. As non-limiting examples, the non-metallic crystalline wear resistant material may comprise, consist of, or consist essentially of polycrystalline diamond, polycrystalline cubic boron nitride, or a combination thereof. As non-limiting examples, tungsten carbide particles may be provided as crushed cast tungsten carbide, spherical cast tungsten carbide, or crushed sintered tungsten carbide. Sintered tungsten carbide may be sintered in any suitable manner including, as a non-limiting example, by hot isostatic pressing of particles of tungsten carbide.

Some or all of the second component wear resistant inserts may comprise a backing substrate. The backing substrate may comprise, consist of, or consist essentially of any material or combination of materials suitable for mounting the second component wear resistant inserts in the coating matrix or to the outer surface of the second radial bearing component. As a non-limiting example, the backing substrate may comprise, consist of, or consist essentially of tungsten carbide. As non-limiting examples, tungsten carbide as a backing substrate may be provided as cast tungsten carbide or sintered tungsten carbide. Sintered tungsten carbide may be sintered in any suitable manner including, as a non-limiting example, by hot isostatic pressing of particles of tungsten carbide.

The second component wear resistant inserts may be arranged in the coating matrix in any suitable manner, including, as non-limiting examples, by thermal fit, interference fit, welding, brazing, soldering, adhesive, etc. The second component wear resistant inserts may by arranged in place while or shortly after the coating matrix is applied to the second radial bearing component so that the coating matrix surrounds the second component wear resistant inserts. Alternatively, the second component wear resistant inserts may be fixed to the coating matrix after the coating matrix is applied to the second radial bearing component. A plurality of pockets may be formed and arranged in the coating matrix, and the second component wear resistant inserts may be mounted in the pockets in any suitable manner, including, as non-limiting examples, by thermal fit, interference fit, welding, brazing, soldering, adhesive, etc.

The second component wear resistant inserts may be arranged in the coating matrix so that they protrude from the coating matrix and thereby protect the coating matrix from wear, or the second component wear resistant inserts may be arranged in the coating matrix so that they are substantially flush with the coating matrix.

The second component wear resistant coating may be applied to the outer surface of the second radial bearing component in any suitable manner having regard to the composition and structure of the second component wear resistant coating. As non-limiting examples, the second component wear resistant coating may be formed separately from the second radial bearing component as a sleeve, may be fabricated integrally with the second radial bearing component, or may be applied to the outer surface of the second radial bearing component. As a result, as non-limiting examples depending upon its composition and structure, the second component wear resistant coating may be applied to the outer surface of the second radial bearing component by a thermal application such as welding, brazing, laser cladding, or plasma transferred arc, or by pressing, spraying, sputtering, vapour deposition, etc.

FIGS. 1-9 are exemplary only. The radial bearing described herein may be used in any suitable apparatus.

In the description of the exemplary embodiments which follows, features which are identical or equivalent in the exemplary embodiments may be identified with the same reference numbers.

Figure 1:
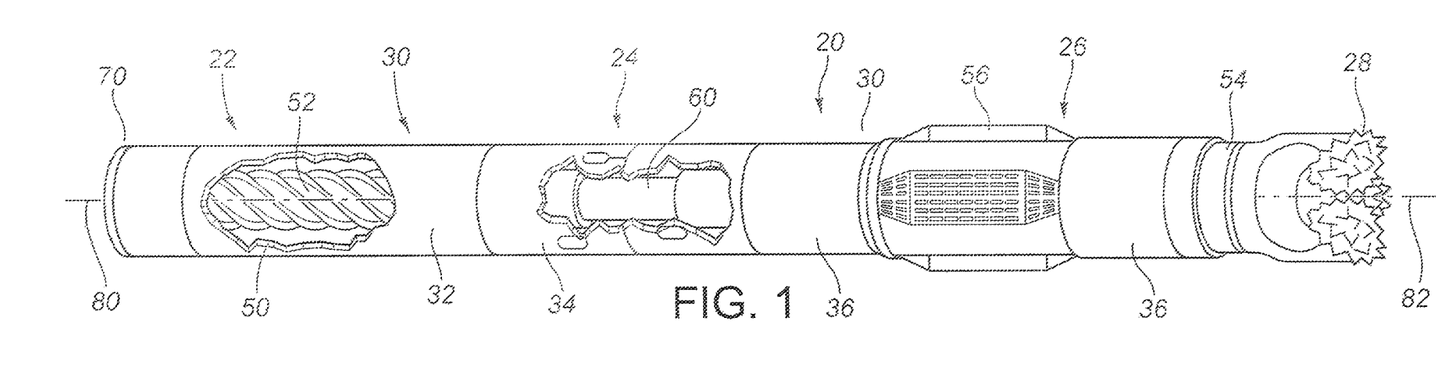
FIG. 1 is a pictorial view of a drilling motor for use in drilling a borehole.

Referring to FIG. 1, an exemplary drilling motor (20) comprises a power section (22) and a bearing section (26). The bearing section (26) is axially distal to the power section (22). One or more sections of the drilling motor (20) may be axially interposed between the power section (22) and the bearing section (26). As depicted in FIG. 1, the drilling motor (20) further comprises a transmission section (24) which is axially interposed between the power section (22) and the bearing section (26). These sections of the drilling motor (20) constitute components of a powertrain which utilizes fluid energy to rotate a drill bit (28). A drill string (70) is connected with the proximal end of the power section (22).

The sections of the drilling motor (20) are contained within a tubular housing (30).

As depicted in FIG. 1, the housing (30) comprises a plurality of housing sections connected together with threaded connections, including a tubular power housing (32) for the power section (22), a tubular transmission housing (34) for the transmission section (24), and a tubular bearing housing (36) for the bearing section (26).

The power housing (32) may comprise a plurality of power housing components which together provide the power housing (32), or the power housing (32) may be a unitary power housing (32) which is formed from a single power housing component.

The transmission housing (34) may comprise a plurality of transmission housing components which together provide the transmission housing (34), or the transmission housing (34) may be a unitary transmission housing (34) which is formed from a single transmission housing component.

The bearing housing (36) may comprise a plurality of bearing housing components which together provide the bearing housing (36), or the bearing housing (36) may be a unitary bearing housing (36) which is formed from a single bearing housing component.

The power section (22) of the drilling motor (20) comprises a stator (50) and a drive member or rotor (52). The stator (50) is fixedly connected with the power housing (32), and the rotor (52) is rotatable within the stator (50) in response to fluid circulating through the power section (22).

As depicted in FIG. 1, the power section (22) is a Moineau-type power section in which the stator (50) and the rotor (52) are lobed. The rotor (52) has one fewer lobe than the stator (50), and rotates eccentrically within the stator (50).

The transmission section (24) accommodates and converts the eccentric movement of the rotor (52) to concentric rotation of a driveshaft (54) within the bearing section (26). The transmission section (24) also transmits rotational drive energy from the power section (22) to the bearing section (26).

As depicted in FIG. 1, the transmission section (24) comprises the transmission housing (34) and a transmission member or transmission shaft (60) which is connected between the rotor (52) and the driveshaft (54) such that eccentric rotation of the rotor (52) results in concentric rotation of the transmission shaft (60), and rotation of the transmission shaft (60) causes rotation of the driveshaft (54).

As depicted in FIG. 1, the bearing section (26) comprises the bearing housing (36), the driveshaft (54) and a bearing assembly (not shown in FIG. 1) comprising one or more thrust bearings and radial bearings which rotatably support the driveshaft (54) within the housing (30). As depicted in FIG. 1, the bearing section (26) also comprises a stabilizer (56) which is threadably connected with the exterior of the bearing housing (36).

As depicted in FIG. 1, the drill bit (28) is connected with the driveshaft (54) so that rotation of the driveshaft (54) causes rotation of the drill bit (28).

The drilling motor (20) has a primary axis (80) and the driveshaft (54) has a driveshaft axis (82). As depicted in FIG. 1, the driveshaft axis (82) is oblique to the primary axis (80) so that there is a "bend" in the drilling motor (20). The bend in the drilling motor (20) may be provided by a bend in the exterior of the housing (30), by a bend in the interior of the housing (30), by an articulation of the driveshaft (54) within the housing (30), or in any other suitable manner.

Figure 2:
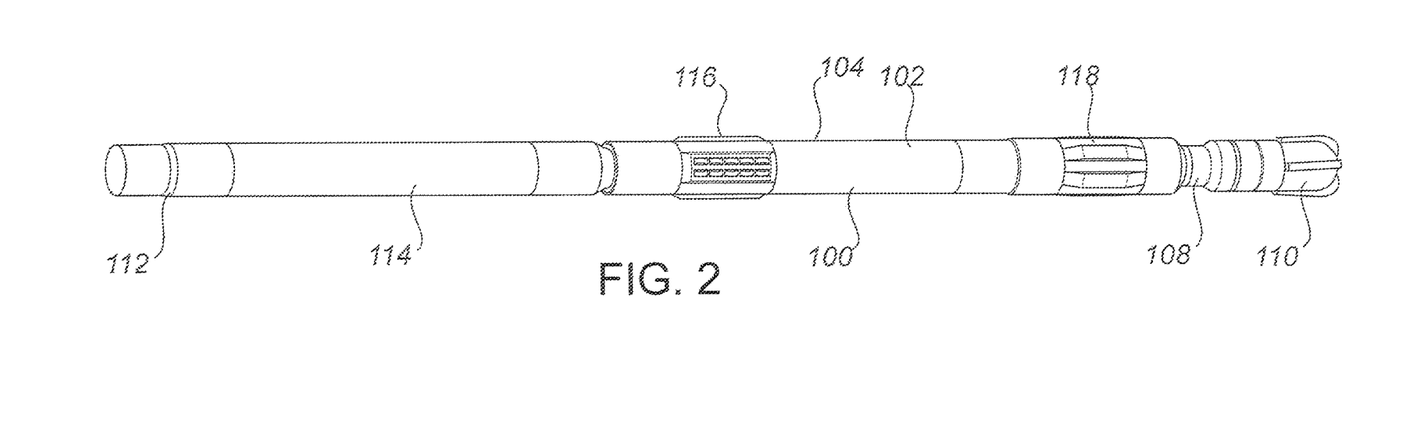
FIG. 2 is a pictorial view of a rotary steerable drilling apparatus for use in drilling a borehole.

Referring to FIG. 2, an exemplary rotary steerable drilling apparatus (100) comprises a housing (102) having an exterior surface (104). A shaft (108) extends through the housing (102). The shaft (108) is rotatable relative to the housing (102).

In the exemplary rotary steerable drilling apparatus (100), a drill bit (110) is connected with a distal end of the shaft (108), and a drill string (112) is connected with a proximal end of the shaft (108). The drill string (112) may include a drill string communication system (114) such as a measurement-while-drilling system.

In the exemplary rotary steerable drilling apparatus (100), an anti-rotation device (116) is connected with or integrated into the housing (102) adjacent to a proximal end of the housing (102), and a near-bit stabilizer (118) is connected with or integrated into the housing (102) adjacent to a distal end of the housing (102).

In the exemplary rotary steerable drilling apparatus (100), a deflection mechanism (not shown) is contained within the housing (102), which may be actuated to cause radial deflection of a portion of the shaft (108) within the housing (102).

The deflection mechanism may be comprised of any structure, device or apparatus which is capable of causing the radial deflection of the portion of the shaft (108) within the housing (102). The radial deflection of the portion of the shaft (108) may result in bending of the shaft (108) within the housing (102). Additionally or alternatively, the radial deflection of the portion of the shaft (108) may result in articulation of the shaft (108) within the housing (102), if the shaft (108) is comprised of a joint (not shown) which facilitates such articulation.

In the exemplary embodiment of the rotary steerable drilling apparatus (100), a bearing assembly (not shown in FIG. 2) is contained within the housing (102), comprising one or more thrust bearings and radial bearings which rotatably support the shaft (108) within the housing (102).

Figure 3:
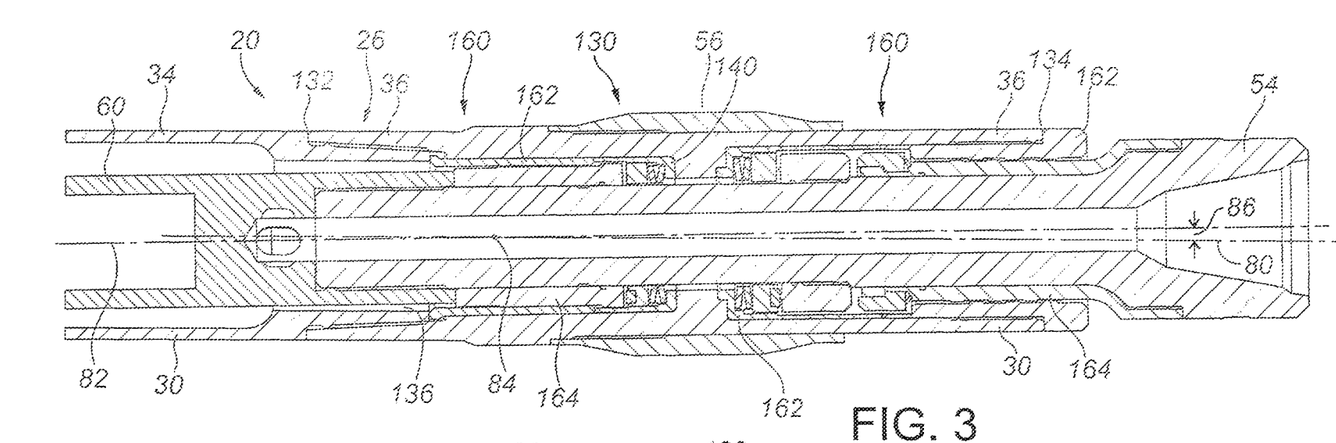
FIG. 3 is a longitudinal section view of a bearing section in an apparatus for use in drilling a borehole.

Referring to FIG. 3, an exemplary bearing section (26) in a drilling apparatus such as the drilling motor (20) comprises a bearing housing (36), a driveshaft (54), and a bearing assembly (130).

The bearing housing (36) has a proximal bearing housing end (132), a distal bearing housing end (134), and defines a bearing housing bore (136). In the exemplary embodiment, the bearing housing (36) is a unitary bearing housing (36) which is formed from a single bearing housing component.

The driveshaft (54) is received within the bearing housing bore (136) and is rotatable relative to the bearing housing (36).

The bearing assembly (130) is radially interposed between the bearing housing (36) and the driveshaft (54) and rotatably supports the driveshaft (54) within the bearing housing bore (136).

In the exemplary embodiment, the transmission section (24) is the only section of the drilling apparatus (20) which is axially interposed between the power section (22) and the bearing section (26). More particularly, the transmission housing (34) is connected directly with both the power housing (32) and the bearing housing (36). As a result, the distal end of the power housing (34) is connected directly with the proximal end of the transmission housing (34), and the distal end of the transmission housing (34) is connected directly with the proximal end of the bearing housing (36). Therefore, the transmission shaft (60) is connected between the rotor (52) and the driveshaft (54).

Referring to FIG. 3, the drilling apparatus (20) has a primary axis (80). In the exemplary embodiment, the primary axis (80) is the axis of the power section (22) and the transmission section (24) of the drilling apparatus.

Referring to FIG. 3, the driveshaft (54) has a driveshaft axis (82). The driveshaft axis (82) is the axis of rotation of the driveshaft (54) within the bearing housing (36).

In the exemplary bearing section (26), the driveshaft axis (82) is oblique to the primary axis (80). The primary axis (80) and the driveshaft axis (82) intersect at an axis intersection point (84). In the exemplary embodiment, the axis intersection point (84) is axially located between the proximal bearing housing end (132) and the distal bearing housing end (134).

In the exemplary bearing section (26), the bearing housing (36) comprises an angular offset (86) which causes the driveshaft axis (82) to be oblique to the primary axis (80). In the exemplary embodiment, the angular offset (86) may comprise a bend in the bearing housing (36), thereby resulting in an "external bend" in the bearing housing. Alternatively, in the exemplary embodiment, the angular offset may comprise a slant or tilt of the bearing housing bore (136) within the bearing housing (36), thereby resulting in an "internal bend" in the bearing housing (36).

In the exemplary bearing section (26), the bearing assembly (130) comprises at least one radial bearing (160).

The radial bearing (160) is adapted to transmit radial loads between the bearing housing (36) and the driveshaft (54). The radial bearing (160) comprises a first radial bearing component (162) which is non-rotatably engaged with the bearing housing (36) and a second radial bearing component (164) which is non-rotatably engaged with the driveshaft (54).

Figure 4:
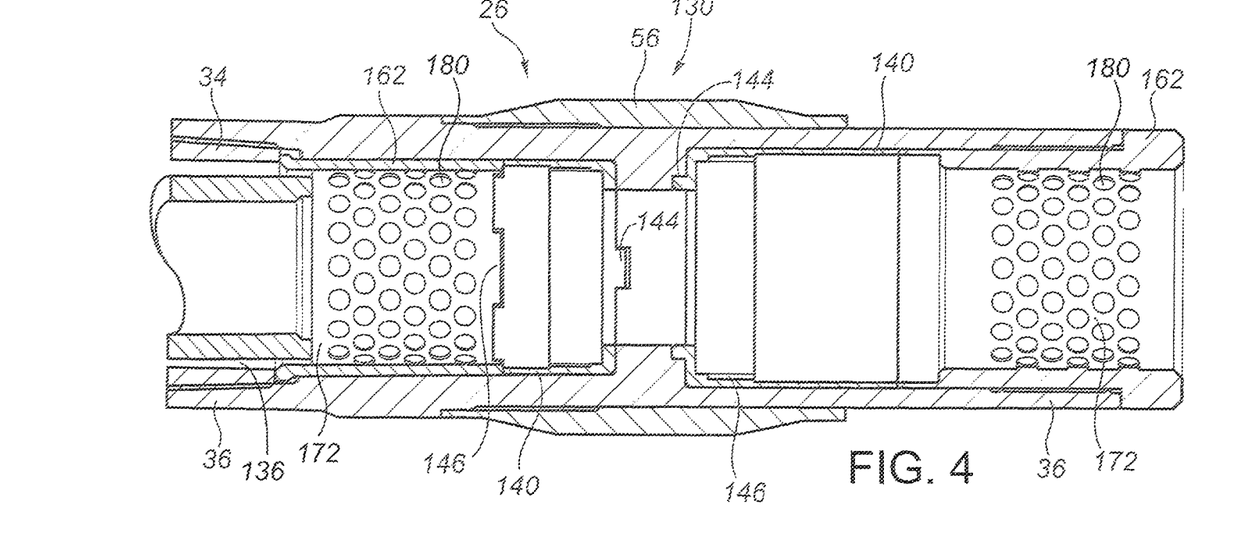
FIG. 4 is a longitudinal section view of first radial bearing components in a bearing housing in the bearing section depicted in FIG. 3.
Figure 5:
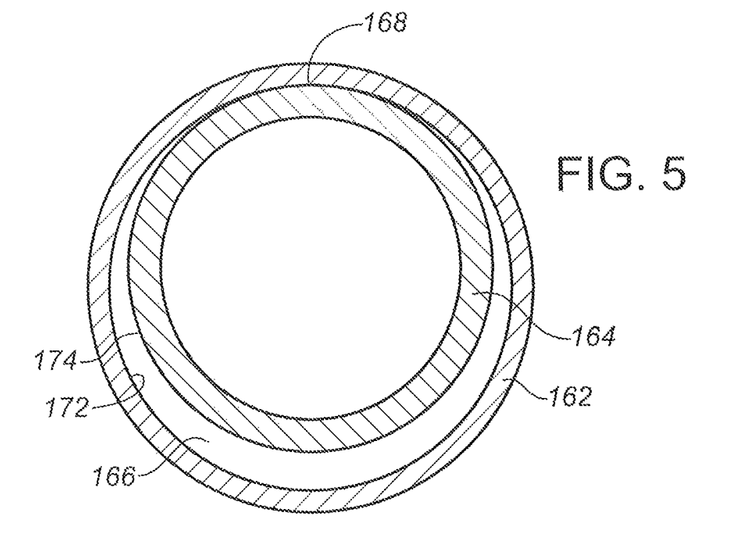
FIG. 5 is a transverse section view of a radial bearing, depicting interaction between a first radial bearing component and a second radial bearing component.
Figure 6:
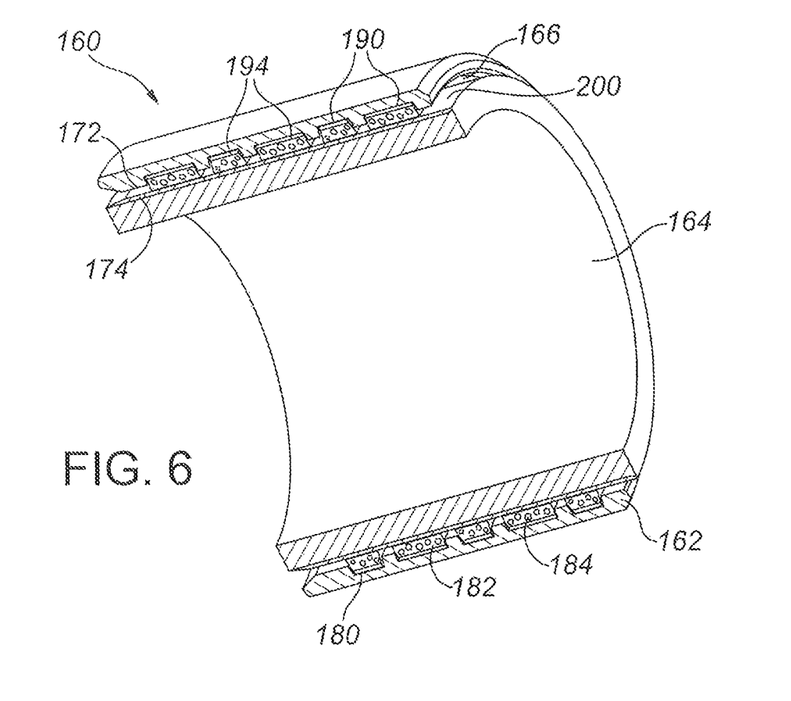
FIG. 6 is a longitudinal section view of an exemplary embodiment of a radial bearing, depicting a first radial bearing component, a plurality of first component wear resistant inserts, a second radial bearing component, and a second component wear resistant coating.

FIG. 4 depicts a bearing housing (26) containing two first radial bearing components (162) according to an exemplary embodiment of the first radial bearing component (162). FIG. 5 depicts an interaction between the first radial bearing component (162) and the second radial bearing component (164) in the radial bearing (160). FIG. 6 depicts an exemplary embodiment of an assembled radial bearing (160), including the exemplary embodiment of the first radial bearing component (162) which is depicted in FIG. 4 and an exemplary embodiment of the second radial bearing component (164) which is depicted in FIG. 8. FIGS. 7A-7E, 8, and 9A-9C depict exemplary embodiments of the second radial bearing component (164).

Referring to FIG. 4, the bearing assembly (130) further comprises a sleeve (140), which is adapted to fit within the bearing housing bore (136). The sleeve (140) is non-rotatably engaged with the bearing housing (36) via complementary engagement surfaces (144).

Referring to FIG. 4, the first radial bearing components (162) are non-rotatably engaged with the sleeve (140) via complementary engagement surfaces (146). As a result, the first radial bearing components (162) are non-rotatably engaged with the bearing housing (36). As depicted in FIG. 4, the complementary engagement surfaces (146) comprise interlocking protrusions and recesses on the first radial bearing component (162) and the sleeve (140) respectively.

Referring to FIGS. 5-6, the first radial bearing component (162) has an inner surface (172) defining a bore (166) and the second radial bearing component (164) has an outer surface (174). As depicted in FIGS. 5-6, the inner surface (172) and the bore (166) of the first radial bearing component (162) and the outer surface (174) of the second radial bearing component (164) are generally cylindrical in shape. The radial bearing (160) is configured so that the second radial bearing component (164) is rotatably received within the bore (166) of the first radial bearing component (162).

Referring to FIG. 5, as a result of the configuration of the radial bearing (160) and/or of the drilling motor (20), the radial load exerted on the first radial bearing component (162) may be concentrated at a radial load location (168) on the first radial bearing component (162). This concentrated radial load may cause the first radial bearing component (162) to be susceptible to uneven and/or accelerated wear.

Referring to FIGS. 4 and 6, in exemplary embodiments the first radial bearing component (162) comprises a plurality of first component wear resistant inserts (180) arranged and mounted on the inner surface (172).

The first component wear resistant inserts (180) may comprise, consist of, or consist essentially of any suitable material or combination of materials, and may be provided in any suitable shape. In the exemplary embodiment of the first radial bearing component (162) depicted in FIG. 4 and FIG. 6, the first component wear resistant inserts (180) are provided with a generally circular cross-section and a generally cylindrical shape.

In the exemplary embodiment of the first radial bearing component (162) depicted in FIG. 4 and FIG. 6, the first component wear resistant inserts (180) comprise a first insert matrix (182) and particles of a non-metallic crystalline wear resistant material (184) such as polycrystalline diamond dispersed in the first insert matrix (182).

The particles of the wear resistant material (184) dispersed in the first insert matrix (182) may be provided in any suitable shape. In the exemplary embodiment of the first radial bearing component (162) depicted in FIG. 4 and FIG. 6, the particles of the wear resistant material (184) dispersed in the first insert matrix (182) have an angular shape due to the crystalline nature of the polycrystalline diamond.

In the exemplary embodiment of the first radial bearing component (162) depicted in FIG. 4 and FIG. 6, the first component wear resistant inserts (180) comprise a backing substrate (194) such as tungsten carbide.

In the exemplary embodiment of the first radial bearing component (162) depicted in FIG. 4 and FIG. 6, the inner surface (172) of the first radial bearing component (162) defines a plurality of pockets (190) arranged on the inner surface (172) and the first component wear resistant inserts (180) are mounted in the pockets (190) by brazing. In the exemplary embodiment of the first radial bearing component (162) depicted in FIG. 4 and FIG. 6, the first component wear resistant inserts (180) are mounted in the pockets (190) so that they protrude from the inner surface of the first radial bearing component (162).

Referring to FIGS. 7A-7E, 8, and 9A-9C, in exemplary embodiments the second radial bearing component (164)

comprises a second component wear resistant coating (200) on at least a portion of the outer surface (174). The second component wear resistant coating (200) may comprise a single continuous coating segment or may comprise a plurality of discrete coating segments.

The second component wear resistant coating (200) may comprise, consist of, or consist essentially of any suitable material or combination of materials. The second component wear resistant coating (200) may consist of or consist essentially of a wear resistant material, or the second component wear resistant coating (200) may further comprise one or more additional materials, such as a coating matrix, for supporting the wear resistant material. The wear resistant material may comprise, consist of, or consist essentially of any material or combination of materials which is suitable for resisting wear of the second radial bearing component, and may be provided in any form.

FIGS. 7A-7E depict embodiments of the second component wear resistant coating (200) in which the second component wear resistant coating (200) comprises a coating matrix (210) such as a braze alloy. In such embodiments, the coating matrix (210) may function to support the wear resistant material within the second component wear resistant coating (200).

As a result, as depicted in FIGS. 7A-7E, the second component wear resistant coating (200) may comprise particles of a wear resistant material (215) dispersed in the coating matrix (210) and/or may comprise a plurality of second component wear resistant inserts (220) arranged in the coating matrix (210), wherein the second component wear resistant inserts (220) comprise a wear resistant material.

The coating matrix (210) may comprise, consist of, or consist essentially of any material or combination of materials suitable for supporting the particles of the wear resistant material (215) dispersed therein and/or the second component wear resistant inserts (220) arranged therein and for applying the second component wear resistant coating (200) on the outer surface (174) of the second radial bearing component (164). As depicted in FIGS. 7A-7E, the coating matrix (210) comprises, consists of, or consists essentially of a braze alloy such as a copper based braze alloy, a nickel based braze alloy, and/or a cobalt based braze alloy.

Figure 7A:
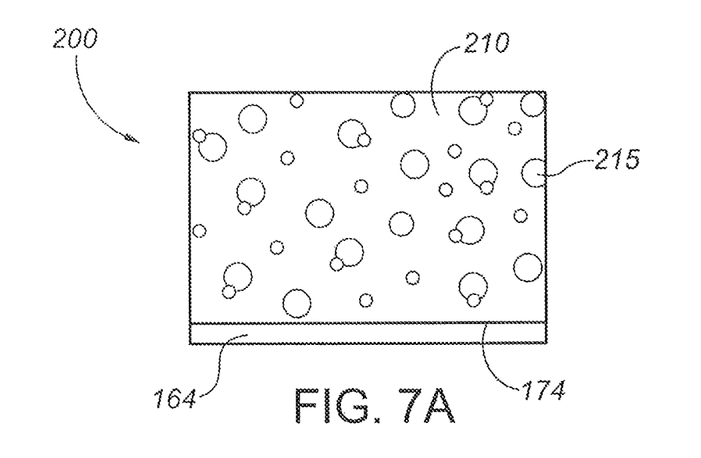
FIGS. 7A-7E are schematic views of exemplary embodiments of a second radial bearing component in which the second component wear resistant coating comprises a coating matrix.
Figure 7B:
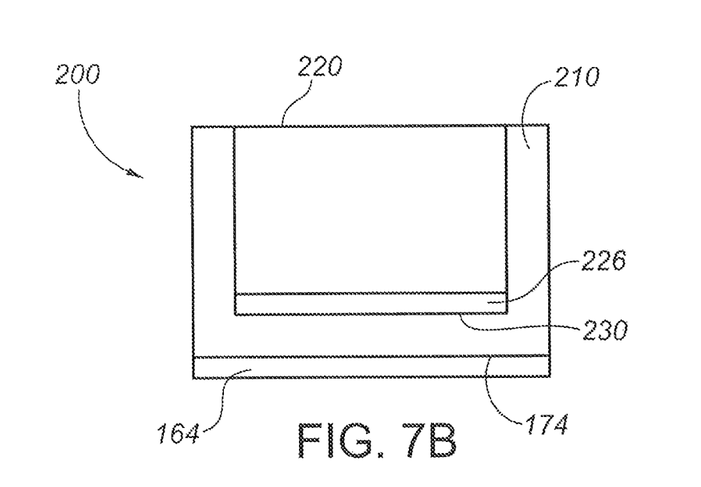
Figure 7C:
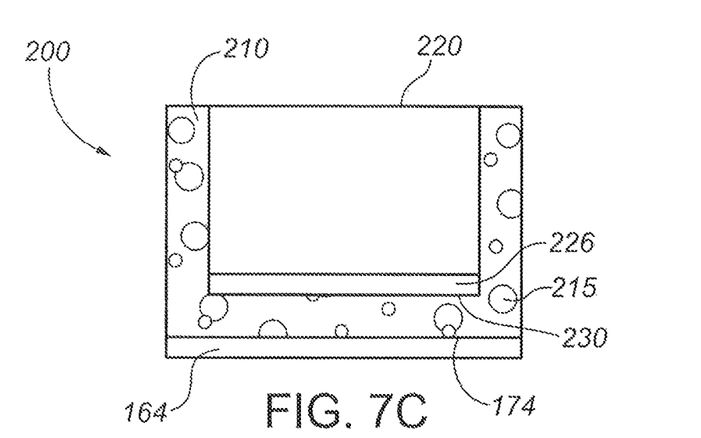
Figure 7D:
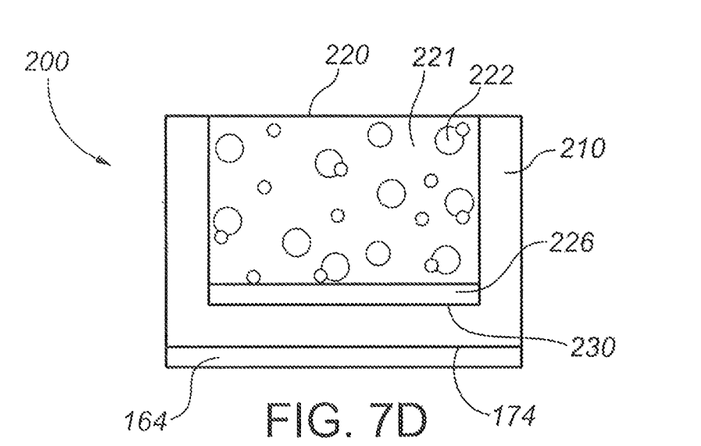
Figure 7E:
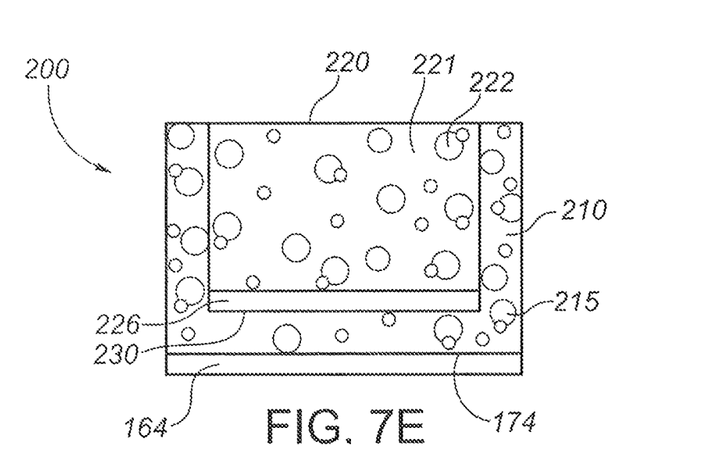
Figure 8:
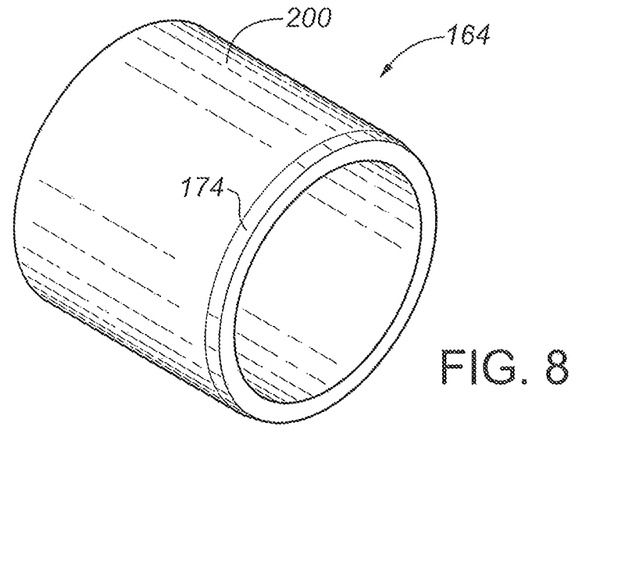
FIG. 8 is a pictorial view of an exemplary embodiment of a second radial bearing component wherein the second component wear resistant coating comprises a single continuous coating segment which covers substantially the entire outer surface of the second radial bearing component.

As depicted in FIGS. 7A, 7C and 7E, the second component wear resistant coating (200) comprises particles of a wear resistant material (215) dispersed in the coating matrix (210). The particles of the wear resistant material (215) dispersed in the coating matrix (210) may comprise, consist of, or consist essentially of any suitable material or combination of materials which is suitable for resisting wear of the second radial bearing component (164), and may be provided in any suitable shape. In particular embodiments represented by FIGS. 7A, 7C, and 7E, the particles of the wear resistant material (215) dispersed in the coating matrix (210) comprise, consist of, or consist essentially of tungsten carbide particles and/or particles of a non-metallic crystalline wear resistant material. Tungsten carbide particles may be provided as crushed cast tungsten carbide, spherical cast tungsten carbide, and/or crushed sintered tungsten carbide. Particles of a non-metallic crystalline wear resistant material may consist essentially of polycrystalline diamond and may have an angular shape due to the crystalline nature of the polycrystalline diamond.

As depicted in FIGS. 7B-7E, the second component wear resistant coating (200) comprises a plurality of second component wear resistant inserts (220) arranged in the coating matrix (210).

The second component wear resistant inserts (220) may have any suitable cross-section and shape. As depicted in FIGS. 7B-7E, the second component wear resistant inserts (220) are provided with a generally circular cross-section and a generally cylindrical shape.

The second component wear resistant inserts (220) may comprise, consist of, or consist essentially of any material or combination of materials suitable for resisting wear of the second radial bearing component.

In particular embodiments represented by FIGS. 7B and 7C, the second component wear resistant inserts (220) may comprise, consist of, or consist essentially of tungsten carbide and/or a non-metallic crystalline wear resistant material. The tungsten carbide may be provided as cast tungsten carbide and/or sintered tungsten carbide. The non-metallic crystalline wear resistant material may consist essentially of polycrystalline diamond.

As depicted in FIGS. 7D and 7E, some or all of the second component wear resistant inserts (220) may comprise a second insert matrix (221) and particles of a wear resistant material (222) dispersed in the second insert matrix (221).

The second insert matrix (221) may comprise, consist of, or consist essentially of any material or combination of materials suitable for supporting the particles of the wear resistant material dispersed therein. In particular embodiments represented by FIGS. 7D and 7E, the second insert matrix (221) comprises, consists of, or consists essentially of tungsten carbide and/or silicon carbide.

The particles of the wear resistant material (222) dispersed in the second insert matrix (221) may comprise, consist of, or consist essentially of any suitable material or combination of materials which is suitable for resisting wear of the second radial bearing component (164), and may be provided in any suitable shape. In particular embodiments represented by FIGS. 7D and 7E, the particles of the wear resistant material (222) dispersed in the second insert matrix (221) comprise, consist of, or consist essentially of tungsten carbide particles and/or particles of a non-metallic crystalline wear resistant material. Tungsten carbide particles may be provided as crushed cast tungsten carbide, spherical cast tungsten carbide, and/or crushed sintered tungsten carbide. Particles of a non-metallic crystalline wear resistant material may consist essentially of polycrystalline diamond and may have an angular shape due to the crystalline nature of the polycrystalline diamond.

As depicted in FIGS. 7B-7E, some or all of the second component wear resistant inserts (220) may comprise a backing substrate (226). The backing substrate (226) may comprise, consist of, or consist essentially of any material or combination of materials suitable for mounting the second component wear resistant inserts (220) in the coating matrix (210) or to the outer surface (174) of the second radial bearing component (164). In particular embodiments represented by FIGS. 7B-7E, the backing substrate comprises, consists of, or consists essentially of tungsten carbide, which may be provided as cast tungsten carbide, or sintered tungsten carbide.

The second component wear resistant inserts (220) may be arranged in the coating matrix (210) in any suitable manner. As depicted in FIGS. 7B-7E, the second component wear resistant inserts (220) are arranged in pockets (230) formed in the coating matrix (210). In particular embodiments represented by FIGS. 7B-7E, the second component wear resistant inserts (220) are mounted in the coating matrix (210) by being brazed into pockets (230) formed in the coating matrix (210). In the particular embodiments represented by FIGS. 7B-7E, the second component wear resistant inserts (220) are mounted in the pockets (230) so that they are substantially flush with the coating matrix (210).

In a first particular exemplary embodiment represented by FIG. 7A, the second component wear resistant coating (200) comprises a coating matrix (210) consisting of, or consisting essentially of a copper based braze alloy, a nickel based braze alloy, and/or a cobalt based braze alloy, and particles of crushed cast tungsten carbide and/or spherical cast tungsten carbide (215) dispersed therein.

In a second particular exemplary embodiment represented by FIG. 7B, the second component wear resistant coating (200) comprises a coating matrix (210) consisting of, or consisting essentially of a copper based braze alloy, a nickel based braze alloy, and/or a cobalt based braze alloy, and a plurality of second component wear resistant inserts (220) arranged in the coating matrix (210), wherein the second component wear resistant inserts (220) comprise, consist of, or consist essentially of sintered tungsten carbide, and wherein the sintered tungsten carbide is formed by hot isostatic pressing of particles of tungsten carbide.

In a third particular exemplary embodiment represented by FIG. 7C, the second component wear resistant coating (200) comprises a coating matrix (210) consisting of, or consisting essentially of a copper based braze alloy, a nickel based braze alloy, and/or a cobalt based braze alloy, particles of tungsten carbide and/or polycrystalline diamond (215) dispersed in the coating matrix (210), and a plurality of second component wear resistant inserts (220) arranged in the coating matrix (210), wherein the second component wear resistant inserts (220) comprise, consist of, or consist essentially of sintered tungsten carbide, wherein the sintered tungsten carbide is formed by hot isostatic pressing of particles of tungsten carbide.

In a fourth particular exemplary embodiment represented by FIG. 7D, the second component wear resistant coating (200) comprises a coating matrix (210) consisting of, or consisting essentially of a copper based braze alloy, a nickel based braze alloy, and/or a cobalt based braze alloy, and a plurality of second component wear resistant inserts (220) arranged in the coating matrix (210), wherein the second component wear resistant inserts (220) comprise tungsten carbide (221) with polycrystalline diamond particles (222) dispersed therein.

In a fifth particular exemplary embodiment represented by FIG. 7E, the second component wear resistant coating (200) comprises a coating matrix (210) consisting of, or consisting essentially of a copper based braze alloy, a nickel based braze alloy, and/or a cobalt based braze alloy, particles of tungsten carbide and/or polycrystalline diamond (215) dispersed in the coating matrix (210), and a plurality of second component wear resistant inserts (220) arranged in the coating matrix (210), wherein the second component wear resistant inserts comprise tungsten carbide (221) with polycrystalline diamond particles (222) dispersed therein.

In a sixth particular exemplary embodiment represented by FIG. 7D, the second component wear resistant coating (200) comprises a coating matrix (210) consisting of, or consisting essentially of a copper based braze alloy, a nickel based braze alloy, and/or a cobalt based braze alloy, and a plurality of second component wear resistant inserts (220) arranged in the coating matrix (210), wherein the second component wear resistant inserts (220) comprise particles of polycrystalline diamond (222) dispersed in a second insert matrix (221), and wherein the second insert matrix (221) may optionally be selected to improve the thermal stability of the second component wear resistant inserts (220).

In a seventh particular exemplary embodiment represented by FIG. 7E, the second component wear resistant coating (200) comprises a coating matrix (210) consisting of, or consisting essentially of a copper based braze alloy, a nickel based braze alloy, and/or a cobalt based braze alloy, particles of tungsten carbide and/or polycrystalline diamond (215) dispersed in the coating matrix (210), and a plurality of second component wear resistant inserts (220) arranged in the coating matrix (210), wherein the second component wear resistant inserts (220) comprise particles of polycrystalline diamond (222) dispersed in a second insert matrix (221), and wherein the second insert matrix (221) may optionally be selected to improve the thermal stability of the second component wear resistant inserts (220).

Figure 9A:
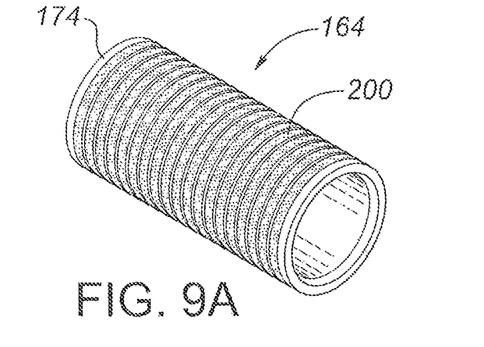
FIGS. 9A-9C are pictorial views of exemplary embodiments of a second radial bearing component wherein the second component wear resistant coating comprises a plurality of discrete coating segments which cover at least a portion of the outer surface of the second radial bearing component.
Figure 9B:
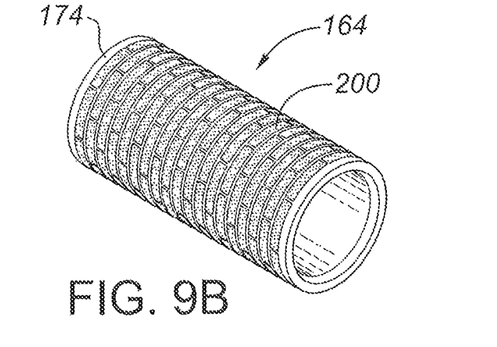
Figure 9C:
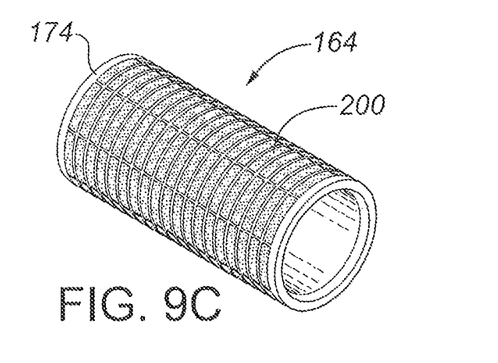

FIG. 8 depicts an exemplary embodiment of the second radial bearing component (164) in which the second component wear resistant coating (200) is provided as a single continuous coating segment which may cover the entire outer surface (174) of the second radial bearing component (164) or only a portion of the outer surface (174) of the second radial bearing component (164). FIGS. 9A-9C depict exemplary embodiments of the second radial bearing component (164) in which the second component wear resistant coating (200) is provided as a plurality of discrete coating segments.

In the exemplary embodiments depicted in FIGS. 8 and 9A-9C, the second component wear resistant coating (200) may comprise, consist of, or consist essentially of a wear resistant material. The wear resistant material may comprise, consist of, or consist essentially of any suitable material or combination of materials which is suitable for resisting wear of the second radial bearing component (164). In the exemplary embodiments depicted in FIGS. 8 and 9A-9C in which the second component wear resistant coating (200) comprises, consists of, or consists essentially of a wear resistant material, the second component wear resistant coating (200) consists essentially of tungsten carbide.

Alternatively, in the exemplary embodiments depicted in FIGS. 8 and 9A-9C, the second component wear resistant coating (200) may comprise a coating matrix (210) with particles of a wear resistant material (215) dispersed therein and/or a plurality of second component wear resistant inserts (220) arranged therein. In the exemplary embodiments depicted in FIGS. 8 and 9A-9C in which the second component wear resistant coating (200) comprises a coating matrix (210) with particles of a wear resistant material (215) dispersed therein and/or a plurality of second component wear resistant inserts (220) arranged therein, the second component wear resistant coating (200) may be selected in the same manner as previously described with respect to FIGS. 7A-7E. A coating segment may be provided in any suitable manner.

In a particular exemplary embodiment represented by FIG. 8, the single continuous coating segment consists of an elongated sleeve which covers substantially the entire outer surface (174) of the second radial bearing component (164) and which consists of or consists essentially of sintered tungsten carbide formed by hot isostatic pressing of particles of tungsten carbide.

In a particular exemplary embodiment represented by FIG. 9A, the plurality of discrete coating segments consists of axially spaced continuous rings, each of which covers a portion of the outer surface (174) of the second radial bearing component (164) and which consists of or consists essentially of sintered tungsten carbide formed by hot isostatic pressing of particles of tungsten carbide.

In a particular exemplary embodiment represented by FIG. 9B, the plurality of discrete coating segments consists of axially spaced intermittent rings of circumferentially staggered ring segments, each of which covers a portion of the outer surface (174) of the second radial bearing component (164) and which consists of or consists essentially of sintered tungsten carbide formed by hot isostatic pressing of particles of tungsten carbide.

In a particular exemplary embodiment represented by FIG. 9C, the plurality of discrete coating segments consists of axially spaced intermittent rings of circumferentially aligned ring segments, each of which covers a portion of the outer surface (174) of the second radial bearing component (164) and which consists of or consists essentially of sintered tungsten carbide formed by hot isostatic pressing of particles of tungsten carbide.

The second component wear resistant coating (200) may be applied to the outer surface (174) of the second radial bearing component (164) in any suitable manner having regard to the composition and structure of the second component wear resistant coating (200), such as by a thermal application such as welding, brazing, laser cladding, or plasma transferred arc, or by pressing, spraying, sputtering, vapour deposition etc. In the exemplary embodiments of FIGS. 8 and 9A-9C, the sleeve, rings and ring segments are pressed or brazed onto the outer surface (174) of the second radial bearing component (164).

A radial bearing (160) as described herein in which the first radial bearing component (162) comprises a plurality of first component wear resistant inserts (180) and a second radial bearing component (164) comprises a second component wear resistant coating (200) may be characterized as a hybrid radial bearing, and may provide one or more potential advantages over radial bearings having other configurations.

A first potential advantage is that the first component wear resistant inserts (180) and the second component wear resistant coating (200) may be selected and designed to address specific loading (such as localized loading) and wear considerations which may apply having regard to the apparatus in which the radial bearing (160) is used and the environment in which the apparatus is used.

A second potential advantage is that the first component wear resistant inserts (180) may provide channels and/or pathways between the radial bearing components (162, 164) which may facilitate cooling and lubrication of the radial bearing components (162, 164).

In particular embodiments in which the first component wear resistant inserts (180) may comprise, consist of, or consist essentially of polycrystalline diamond as a wear resistant material and the second component wear resistant coating (200) may comprise, consist of, or consist essentially of tungsten carbide as a wear resistant material, more specific potential advantages may arise in comparison with radial bearings which consist of or consist essentially of only polycrystalline diamond or tungsten carbide as the wear resistant material.

First, polycrystalline diamond may provide improved wear resistance of the first radial bearing component (162) in comparison with other wear resistant materials, particularly in circumstances in which the radial load is concentrated at a radial load location (168) on the first radial bearing component (162).

Second, radial bearings having tungsten carbide surfaces on both of the radial bearing components (162, 164) may be susceptible to material transfer (smearing) of tungsten carbide between the radial bearing components (162, 164), which may increase the friction between the radial bearing components (162, 164) and/or the wear of the radial bearing components (162, 164). It is believed that this material transfer will be reduced or eliminated by a hybrid radial bearing (160) in which the first radial bearing component (162) comprises, consists of, or consists essentially of polycrystalline diamond and the second radial bearing component (164) comprises, consists of, or consists essentially of tungsten carbide.

Third, since tungsten carbide is typically less wear resistant than polycrystalline diamond, initial wear of the tungsten carbide during use of the radial bearing (160) may over time result in more even load distribution between the first component wear resistant inserts (180) and the second component wear resistant coating (200), which may then reduce the overall wear rate of the radial bearing (160).

Fourth, the second radial bearing component (164) may typically be more susceptible to bending than the first radial bearing component (162) due to the different structural and material properties of the radial bearing components (162, 164). Excessive bending loads may result in failure of the bond between a wear resistant insert and a radial bearing component, while tungsten carbide based coatings may exhibit relatively higher bond strength and improved toughness. As a result, by providing tungsten carbide as a wear resistant material on the second bearing component (164), the likelihood of failure due to excessive bending loads on the second bearing component (164) may be reduced.

Fifth, tungsten carbide based coatings may not typically provide channels and/or pathways between the bearing components (162, 164) and therefore may not be readily cooled or lubricated. By providing the first component wear resistant inserts (180) on the first radial bearing component (162), channels and/or pathways are inherently provided between the radial bearing components (162, 164), which facilitates cooling and lubrication of the second component wear resistant coating (200) as well as the first component wear resistant inserts (180).

Sixth, it is believed that the coefficient of friction between two tungsten carbide surfaces in a radial bearing will generally be higher than the coefficient of friction between a surface comprising polycrystalline diamond and a surface comprising tungsten carbide, which may result in reduced heating and/or reduced wear of the radial bearing (160) in comparison with radial bearings which include only tungsten carbide surfaces.

ADDITIONAL DISCLOSURES

The following are non-limiting, specific embodiments of the radial bearing described herein:

Embodiment A. A radial bearing for transmitting a radial load, comprising:
(a) a first radial bearing component having an inner surface defining a bore, wherein the first radial bearing component comprises a plurality of first component wear resistant inserts arranged and mounted on the inner surface; and
(b) a second radial bearing component received within the bore of the first radial bearing component and having an outer surface, wherein the second radial bearing component comprises a second component wear resistant coating on at least a portion of the outer surface, and wherein the first radial bearing component and the second radial bearing component interact to transmit the radial load between the first radial bearing component and the second radial bearing component.

Embodiment B. The radial bearing of Embodiment A wherein the first component wear resistant inserts comprise a first insert matrix and particles of a non-metallic crystalline wear resistant material dispersed in the first insert matrix.

Embodiment C. The radial bearing of Embodiment B wherein the particles of the non-metallic crystalline wear resistant material dispersed in the first insert matrix comprise polycrystalline diamond.

Embodiment D. The radial bearing of any one of Embodiments A through C wherein each of the first component wear resistant inserts further comprises a backing substrate.

Embodiment E. The radial bearing of any one of Embodiments A through D wherein the inner surface of the first radial bearing component defines a plurality of pockets arranged on the inner surface and wherein the first component wear resistant inserts are mounted in the pockets by brazing.

Embodiment F. The radial bearing of any one of Embodiments A through E wherein the second component wear resistant coating comprises a coating matrix and particles of a wear resistant material dispersed in the coating matrix.

Embodiment G. The radial bearing of Embodiment F wherein at least some of the particles of the wear resistant material dispersed in the coating matrix are tungsten carbide particles.

Embodiment H. The radial bearing of Embodiment F wherein at least some of the particles of the wear resistant material dispersed in the coating matrix are particles of a non-metallic crystalline wear resistant material.

Embodiment I. The radial bearing of Embodiment H wherein the particles of the non-metallic crystalline wear resistant material dispersed in the coating matrix comprise polycrystalline diamond.

Embodiment J. The radial bearing of any one of Embodiments F through I wherein the coating matrix comprises a braze alloy.

Embodiment K. The radial bearing of any one of Embodiments A through K wherein the second component wear resistant coating comprises a coating matrix and a plurality of second component wear resistant inserts arranged in the coating matrix.

Embodiment L. The radial bearing of Embodiment K wherein at least some of the second component wear resistant inserts comprise tungsten carbide.

Embodiment M. The radial bearing of Embodiment K wherein at least some of the second component wear resistant inserts comprise tungsten carbide and are formed by hot isostatic pressing of particles of the tungsten carbide.

Embodiment N. The radial bearing of any one of Embodiments K through M wherein at least some of the second component wear resistant inserts comprise tungsten carbide and particles of a non-metallic crystalline wear resistant material.

Embodiment O. The radial bearing of Embodiment N wherein the particles of the non-metallic crystalline wear resistant material in the second component wear resistant inserts comprise polycrystalline diamond.

Embodiment P. The radial bearing of any one of Embodiments K through O wherein at least some of the second component wear resistant inserts comprise a second insert matrix and particles of a non-metallic crystalline wear resistant material dispersed in the second insert matrix.

Embodiment Q. The radial bearing of Embodiment P wherein the particles of the non-metallic crystalline wear resistant material dispersed in the second insert matrix comprise polycrystalline diamond.

Embodiment R. The radial bearing of any one of Embodiments F through Q wherein the coating matrix comprises a braze alloy.

Embodiment S. The radial bearing of any one of Embodiments A through E wherein the second component wear resistant coating consists essentially of tungsten carbide.

Embodiment T. The radial bearing of any one of Embodiments A through S wherein the radial bearing is a component of an apparatus for use in a borehole.

Embodiment U. The radial bearing of any one of Embodiments A through T wherein the radial bearing is a component of a drilling apparatus for use in drilling a borehole.

Embodiment V. The radial bearing of any one of Embodiments A through U wherein the drilling apparatus is a drilling motor.

Embodiment W. The radial bearing of any one of Embodiments A through U wherein the drilling apparatus is a rotary steerable drilling apparatus.

In this document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

I claim:

1. A radial bearing for transmitting a radial load, comprising:
   (a) a first radial bearing component having an inner surface defining a bore, wherein the first radial bearing component comprises a plurality of first component wear resistant inserts arranged and mounted on the inner surface, wherein the first component wear resistant inserts comprise a first insert matrix and particles of polycrystalline diamond dispersed in the first insert matrix; and
   (b) a second radial bearing component received within the bore of the first radial bearing component and having an outer surface, wherein the second radial bearing component comprises a second component wear resistant coating on at least a portion of the outer surface, wherein the second component wear resistant coating comprises a coating matrix and a plurality of second component wear resistant inserts arranged in the coating matrix, wherein at least some of the second component wear resistant inserts comprise tungsten carbide and particles of a non-metallic crystalline wear resistant material, and wherein the first radial bearing component and the second radial bearing component interact to transmit the radial load between the first radial bearing component and the second radial bearing component.

2. The radial bearing as claimed in claim 1 wherein each of the first component wear resistant inserts further comprises a backing substrate.

3. The radial bearing as claimed in claim 2 wherein the inner surface of the first radial bearing component defines a plurality of pockets arranged on the inner surface and wherein the first component wear resistant inserts are mounted in the pockets by brazing.

4. The radial bearing as claimed in claim 1 wherein the second component wear resistant coating comprises particles of a wear resistant material dispersed in the coating matrix.

5. The radial bearing as claimed in claim 4 wherein at least some of the particles of the wear resistant material dispersed in the coating matrix are tungsten carbide particles.

6. The radial bearing as claimed in claim 4 wherein at least some of the particles of the wear resistant material dispersed in the coating matrix are particles of a non-metallic crystalline wear resistant material.

7. The radial bearing as claimed in claim 6 wherein the particles of the non-metallic crystalline wear resistant material dispersed in the coating matrix comprise polycrystalline diamond.

8. The radial bearing as claimed in claim 4 wherein the coating matrix comprises a braze alloy.

9. The radial bearing as claimed in claim 1 wherein the particles of the non-metallic crystalline wear resistant material in the second component wear resistant inserts comprise polycrystalline diamond.

10. The radial bearing as claimed in claim 1 wherein the coating matrix comprises a braze alloy.

11. The radial bearing as claimed in claim 1 wherein the radial bearing is a component of a drilling motor.

12. The radial bearing as claimed in claim 1 wherein the radial bearing is a component of a rotary steerable drilling apparatus.

13. A radial bearing for transmitting a radial load, comprising:
(a) a first radial bearing component having an inner surface defining a bore, wherein the first radial bearing component comprises a plurality of first component wear resistant inserts arranged and mounted on the inner surface, wherein the first component wear resistant inserts comprise a first insert matrix and particles of polycrystalline diamond dispersed in the first insert matrix; and
(b) a second radial bearing component received within the bore of the first radial bearing component and having an outer surface, wherein the second radial bearing component comprises a second component wear resistant coating on at least a portion of the outer surface, wherein the second component wear resistant coating comprises a coating matrix and a plurality of second component wear resistant inserts arranged in the coating matrix, wherein at least some of the second component wear resistant inserts comprise a second insert matrix and particles of a non-metallic crystalline wear resistant material dispersed in the second insert matrix, and wherein the first radial bearing component and the second radial bearing component interact to transmit the radial load between the first radial bearing component and the second radial bearing component.

14. The radial bearing as claimed in claim 13 wherein the particles of the non-metallic crystalline wear resistant material dispersed in the second insert matrix comprise polycrystalline diamond.

15. The radial bearing as claimed in claim 13 wherein each of the first component wear resistant inserts further comprises a backing substrate.

16. The radial bearing as claimed in claim 15 wherein the inner surface of the first radial bearing component defines a plurality of pockets arranged on the inner surface and wherein the first component wear resistant inserts are mounted in the pockets by brazing.

17. The radial bearing as claimed in claim 13 wherein the second component wear resistant coating comprises particles of a wear resistant material dispersed in the coating matrix.

18. The radial bearing as claimed in claim 17 wherein at least some of the particles of the wear resistant material dispersed in the coating matrix are tungsten carbide particles.

19. The radial bearing as claimed in claim 17 wherein at least some of the particles of the wear resistant material dispersed in the coating matrix are particles of a non-metallic crystalline wear resistant material.

20. The radial bearing as claimed in claim 19 wherein the particles of the non-metallic crystalline wear resistant material dispersed in the coating matrix comprise polycrystalline diamond.

21. The radial bearing as claimed in claim 17 wherein the coating matrix comprises a braze alloy.

22. The radial bearing as claimed in claim 13 wherein the coating matrix comprises a braze alloy.

23. The radial bearing as claimed in claim 13 wherein the radial bearing is a component of a drilling motor.

24. The radial bearing as claimed in claim 13 wherein the radial bearing is a component of a rotary steerable drilling apparatus.

* * * * *